United States Patent
Lin et al.

(10) Patent No.: US 9,899,078 B2
(45) Date of Patent: Feb. 20, 2018

(54) RESISTIVE RANDOM ACCESS MEMORY WITH HIGH-RELIABILITY AND MANUFACTURING AND CONTROL METHODS THEREOF

(71) Applicant: Winbond Electronics Corp., Taichung (TW)

(72) Inventors: Meng-Heng Lin, Taichung (TW); Bo-Lun Wu, Changhua County (TW); Chien-Min Wu, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/950,689

(22) Filed: Nov. 24, 2015

(65) Prior Publication Data

US 2016/0148684 A1    May 26, 2016

(30) Foreign Application Priority Data

Nov. 26, 2014  (TW) .............................. 103140936 A

(51) Int. Cl.
*G11C 13/00*    (2006.01)

(52) U.S. Cl.
CPC ........ *G11C 13/0026* (2013.01); *G11C 13/004* (2013.01); *G11C 13/0033* (2013.01); *G11C 2213/79* (2013.01); *G11C 2213/82* (2013.01)

(58) Field of Classification Search
CPC .............. G11C 13/0026; G11C 13/004; G11C 13/0028
See application file for complete search history.

(56) References Cited

U.S. PATENT DOCUMENTS

| | | | | |
|---|---|---|---|---|
| 7,221,585 B2* | 5/2007 | Bessho | ................... | G11C 11/16 365/158 |
| 8,004,872 B2 | 8/2011 | Jung et al. | | |
| 2005/0078505 A1* | 4/2005 | Voshell | ..................... | G11C 7/06 365/148 |
| 2008/0106958 A1* | 5/2008 | Kwon | ..................... | G11C 29/16 365/201 |
| 2010/0091596 A1* | 4/2010 | Bang | .................. | G01R 31/3004 365/201 |
| 2011/0267874 A1* | 11/2011 | Ryu | ........................ | G11C 11/16 365/158 |
| 2013/0148405 A1* | 6/2013 | Kang | ....................... | G11C 5/06 365/148 |
| 2014/0119107 A1* | 5/2014 | Cha | ..................... | G11C 11/1673 365/158 |

* cited by examiner

*Primary Examiner* — J. H. Hur

(74) *Attorney, Agent, or Firm* — Muncy, Geissler, Olds & Lowe, P.C.

(57) ABSTRACT

A high-reliability resistive random access memory (RRAM). A memory cell of a memory cell array is controlled via a word line, a bit line and a source line. The control unit of the RRAM has a word line decoder, a bit line decoder, and a source line decoder and switch circuit. The word line decoder, the bit line decoder and the source line decoder respectively control the voltage applied to the word line, the voltage applied to the bit line, and the voltage applied to the source line. The switch circuit is switched between a first state and a second state to operate the bit line decoder to apply a voltage to the bit line to read the memory cell and to operate the source line decoder to apply a voltage to the source line to read the memory cell alternately.

11 Claims, 5 Drawing Sheets

Switch circuit in state 1, a bit line read operation is performed.

Switch circuit in state 2, a source line read operation is performed.

Switch circuit in state 1, a bit line read operation is performed.

Switch circuit in state 2, a source line read operation is performed.

RESISTIVE RANDOM ACCESS MEMORY WITH HIGH-RELIABILITY AND MANUFACTURING AND CONTROL METHODS THEREOF

CROSS REFERENCE TO RELATED APPLICATIONS

This Application claims priority of Taiwan Patent Application No.103140936, filed on Nov. 26, 2014, the entirety of which is incorporated by reference herein.

BACKGROUND OF THE INVENTION

Field of the Invention

The present invention relates to a resistive random access memory (RRAM), and especially relates to a switchable read operation of RRAM and the manufacturing and the control methods thereof.

Description of the Related Art

A resistive random access memory (RRAM) usually includes a plurality of memory cells each having a transistor and a resistor, in which the memory cell can be biased by an external voltage to change the resistance of the resistor so as to be written or erased. That is, the memory cell can be switched between a high-resistance-state and a low-resistance-state to represent different digital information ('0' or '1'). The RRAM memory cell not only has a simple structure, but also can be manufactured in a stacked manner for high cell density. Furthermore, the operation voltage of the RRAM memory cell is quite low; therefore, RRAM is a very promising memory technology.

The read/write characteristics of the memory cells may be failure if the memory cells are accessed frequently, such that the digital data stored in the memory cells cannot be read out normally. Furthermore, semiconductor components such as RRAMs are usually tested for reliability under high-temperature conditions, for example, 85° C. These high-temperature reliability tests may also damage the read/write characteristics of the memory cells.

BRIEF SUMMARY OF THE INVENTION

The control and manufacturing methods of a high-reliability RRAM (resistive random access memory) and the RRAM are discussed in the paper.

An RRAM in accordance with an exemplary embodiment of the disclosure has a plurality of memory cells and a control unit. The memory cells provided within a memory cell array and each memory cell is controlled via a word line, a bit line and a source line. The control unit has a word line decoder, a bit line decoder, a source line decoder and a switch circuit. The word line decoder sets the voltage on the word line. The bit line decoder sets the voltage on the bit line. The source line decoder sets the voltage on the source line. The switch circuit is switched between a first state and a second state to operate the bit line decoder and the source line decoder alternately to apply a read voltage to the bit line and the source line alternately to read the memory cell.

In an exemplary embodiment, every M times after the bit line decoder applies the read voltage to the bit line to read the memory cell, the control unit switches the switch circuit to change to operate the source line decoder to apply the read voltage to the source line to read the memory cell. Every N times after the source line decoder applies the read voltage to the source line to read the memory cell, the control unit switches the switch circuit to change to operate the bit line decoder to apply the read voltage to the bit line to read the memory cell.

A manufacturing method for a resistive random access memory in accordance with an exemplary embodiment of the disclosure comprises: manufacturing a switch circuit in a control unit of the resistive random access memory, the switch circuit switching between a first state and a second state; and repeatedly reading a memory cell of the resistive random access memory for a reliability test, by which the switch circuit is switched between the first state and the second state and thereby a bit line decoder and a source line decoder are operated alternately to apply a read voltage to a bit line and a source line alternately to read the memory cell. The memory cell is provided with a memory cell array and is controlled via a word line, the bit line and the source line.

A control method for a resistive random access memory in accordance with an exemplary embodiment of the disclosure comprises: providing a switch circuit in a control unit of the resistive random access memory; providing at least one read mode switching condition, wherein the switch circuit is switched between a first state and a second state according to the read mode switching condition; and reading a memory cell of the resistive random access memory, by applying a read voltage to a bit line coupled to the memory cell or to a source line coupled to the memory cell according to whether the read mode switching condition is satisfied. The memory cell is provided with a memory cell array and is controlled via a word line, the bit line and the source line.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments for carrying out the invention. This description is made for the purpose of illustrating the general principles of the invention and should not be taken in a limiting sense. The scope of the invention is best determined by reference to the appended claims.

Figure 1:
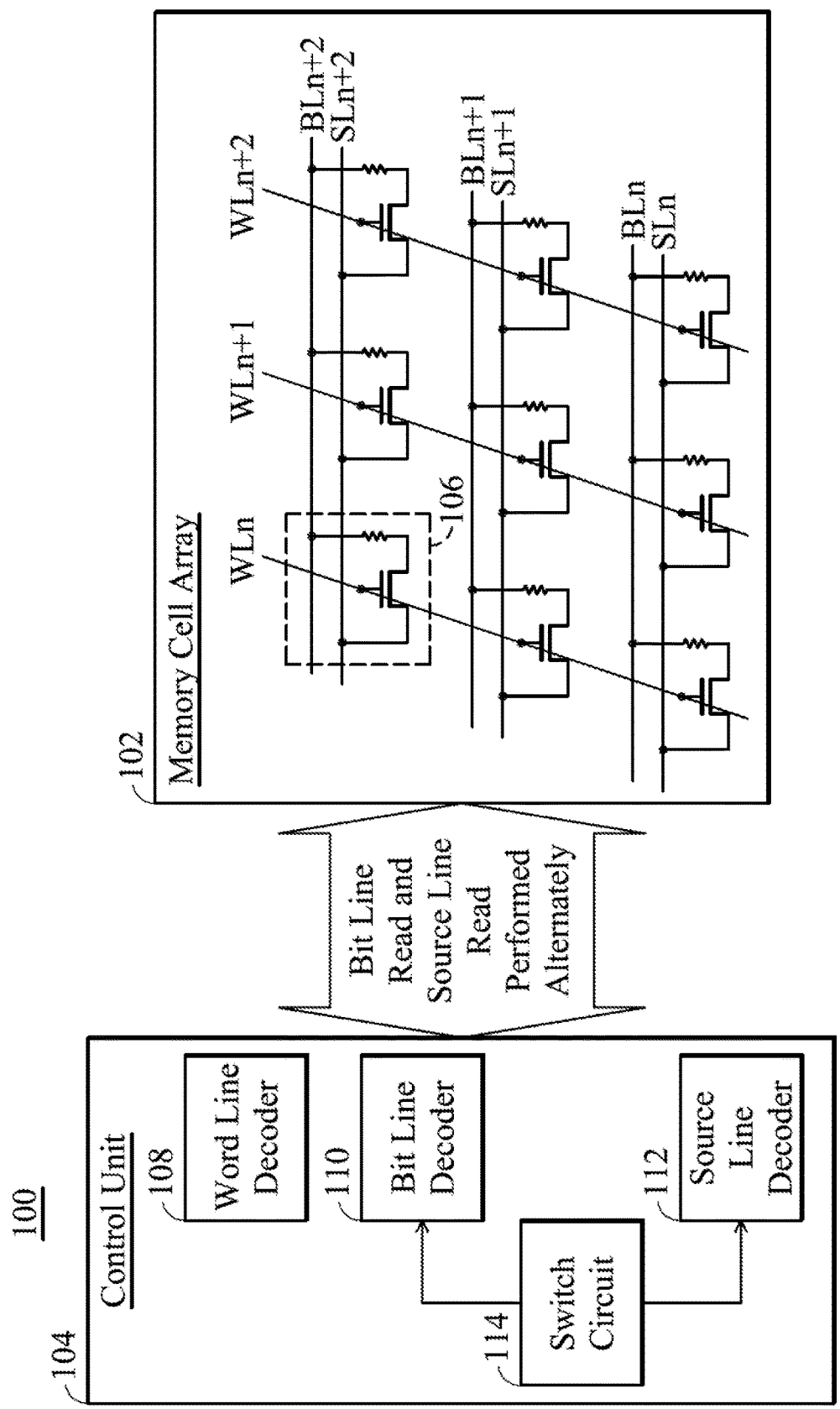
FIG. 1 shows a resistive random access memory (RRAM) 100 in accordance with an exemplary embodiment of the disclosure.

FIG. 1 shows a resistive random access memory (RRAM) 100 in accordance with an exemplary embodiment of the disclosure, which comprises a memory cell array 102 and a control unit 104. The memory cell array 102 has a plurality of memory cells controlled by a plurality of word lines WLn, WLn+1, WLn+2 and so on, a plurality of bit lines BLn, BLn+1, BLn+2 and so on, and a plurality of source lines SLn, SLn+1, SLn+2 and so on. Each memory cell has a resistor and a transistor coupled in series. The gate, drain and source of the transistor are respectively coupled to a corresponding word line, a corresponding bit line and a corresponding source line. When a word line is biased, the transistors of the memory cells controlled by the word line are all turned on to be read or written according to the voltages applied on the bit lines of the memory cells. For simplicity, only one memory cell 106 is discussed in the following description. As shown, the memory cell 106 is provided within the memory cell array 102 to be controlled via the word line WLn, bit line BLn+2 and source line SLn+2.

The control unit 104 has a word line decoder 108, a bit line decoder 110, a source line decoder 112, and a switch circuit 114. The voltage applied to the word line WLn is set by the word line decoder 108. The voltage applied to the bit line BLn+2 is set by the bit line decoder 110. The voltage applied to the source line SLn+2 is set by the source line decoder 112. The switch circuit 114 is switched between a first state and a second state. For example, the switch circuit 114 may be a flip-flop. By switching the switch circuit 114 between the first and second states, the bit line decoder 110 and the source line decoder 112 are operated alternately, and thereby the read voltage is applied to the bit line BLn+2 and applied to the source line SLn+2 alternately to read the memory cell 106.

In an exemplary embodiment, after every M times of operating the bit line decoder 110 by the control unit 104 to apply a read voltage to the bit line BLn+2 to read the memory cell 106, the control unit 104 switches the switch circuit 114 to operate the source line decoder 112 to apply a read voltage to the source line SLn+2 to read the memory cell 106. In some exemplary embodiments, after every N times of operating the source line decoder 112 by the control unit 104 to apply the read voltage to the source line SLn+2 to read the memory cell 106, the control unit 104 further switches the switch circuit 114 to operate the bit line decoder 110 to apply the read voltage to the bit line BLn+2 to read the memory cell 106. M and N are nonzero numbers. In an exemplary embodiment, M and N both may be one. That is, every time after the control unit 104 operates the bit line decoder 110 to apply the read voltage to the bit line BLn+2 to read the memory cell 106, the control unit 104 switches the switch circuit 114 to operate the source line decoder 112 to apply the read voltage to the source line SLn+2 to read the memory cell 106. Furthermore, every time after the control unit 104 operates the source line decoder 112 to apply the read voltage to the source line SLn+2 to read the memory cell 106, the control unit 104 further switches the switch circuit 114 to operate the bit line decoder 110 to apply the read voltage to the bit line BLn+2 to read the memory cell 106.

Figure 2A:
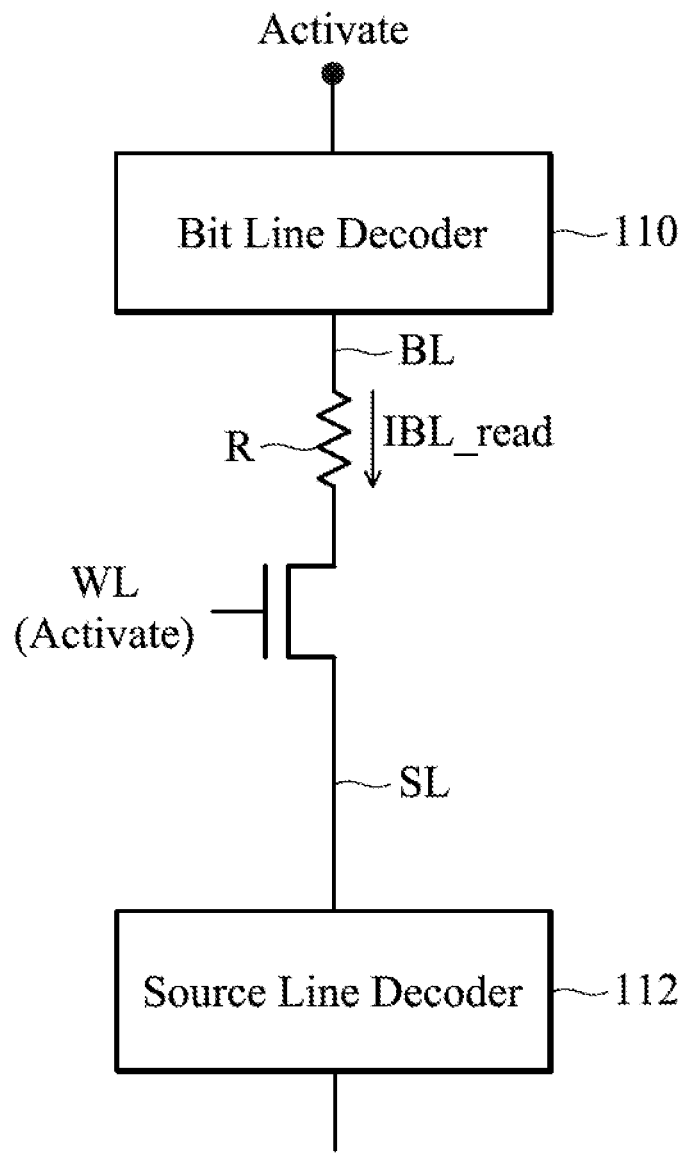
FIG. 2A and FIG. 2B shows how a memory cell is read in the different states of the switch circuit 114.
Figure 2B:
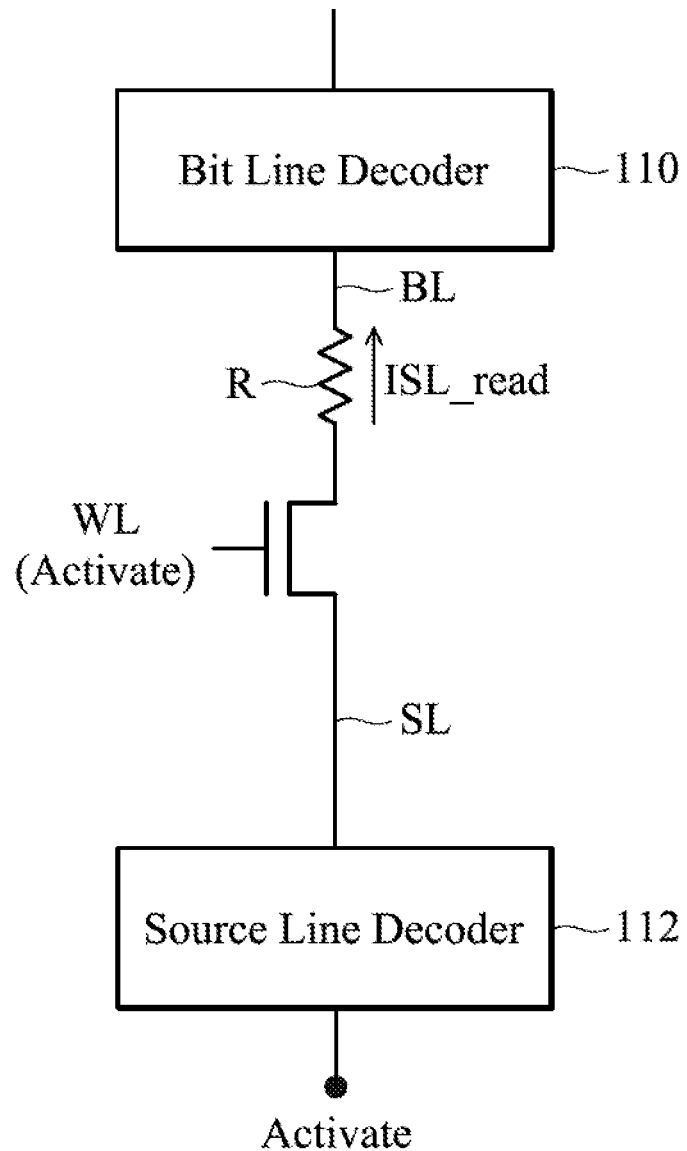

FIG. 2A and FIG. 2B shows how a memory cell is read in the different states of the switch circuit 114.

FIG. 2A shows that the switch circuit 114 is in a first state. The control unit 104 operates the bit line decoder 110 to apply a read voltage to the bit line BL. For example, the bit line BL voltage may be 0.2~0.3 volts, the source line SL voltage may be 0 volts. A read current IBL_read flows through the resistor R between the bit line BL and the transistor to reflect the digital information in the memory cell.

FIG. 2B shows that the switch circuit 114 is in a second state. The control unit 104 operates the source line decoder 112 to apply a read voltage to the source line SL. For example, the source line SL voltage may be 0.2~0.3 volts, the bit line BL voltage may be 0 volts. A read current ISL_read flows through the resistor R to reflect the digital information in the memory cell.

The read/write characteristics of the memory cells are protected from becoming damaged because the opposite direction read currents IBL_read (referring to FIG. 2A) and ISL_read (referring to FIG. 2B) are used as an alternately. Therefore, the lifetime of the RRAM is considerably expanded.

Figure 3:
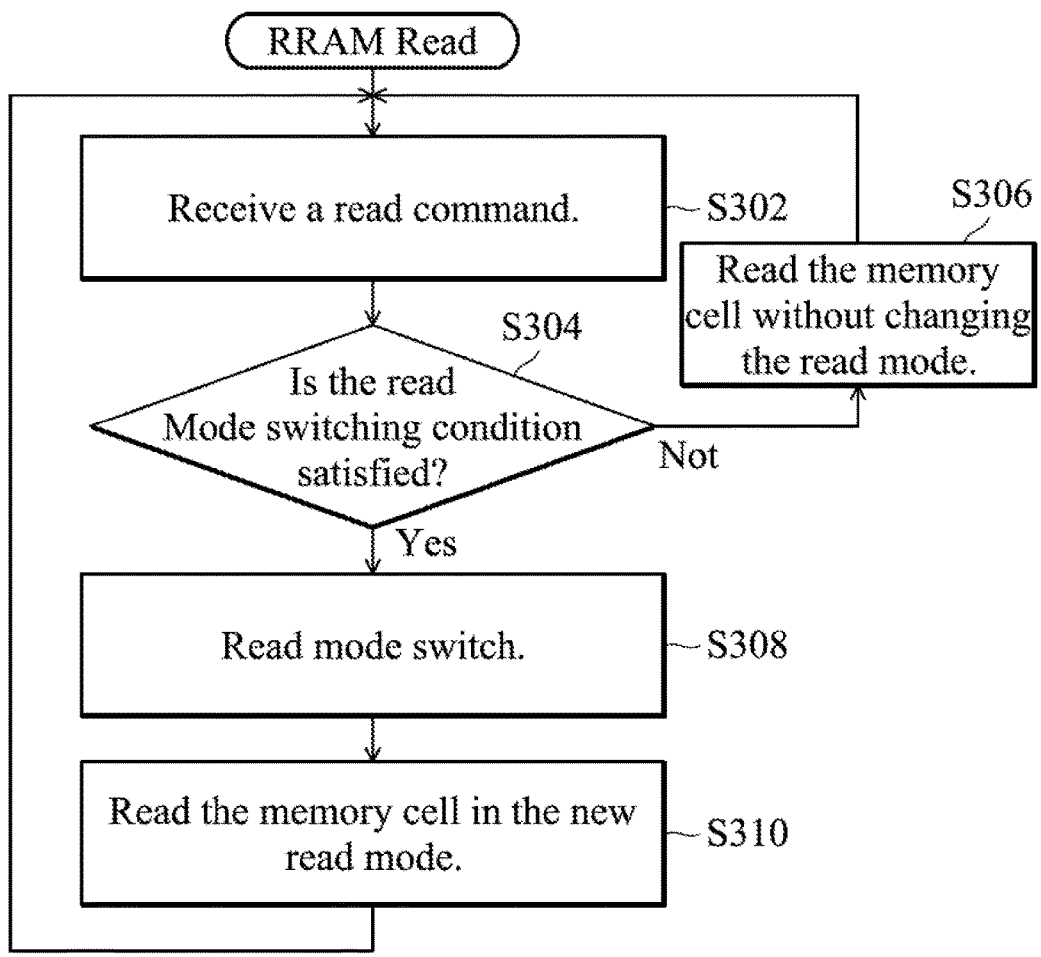
FIG. 3 is a flowchart depicting read operations performed on an RRAM.

FIG. 3 is a flowchart depicting read operations performed on an RRAM. A read command is received in step S302. In step S304, it is checked whether a read mode switching condition is satisfied. For example, it is checked in step S304 whether bit line read operations (referring to FIG. 2A) have been performed M times on the memory cell, or whether source line read operations (referring to FIG. 2B) have been performed N times on the memory cell. If not, step S306 is performed to read the memory cell without changing the read mode. If the read mode switching condition is satisfied, for example, when the memory cell has been read by M times of the bit line read operation or by N times of the source line read operation, step S308 is performed to change the read mode. The read operation may be changed from the bit line read operation of FIG. 2A to the source line read operation of FIG. 2B or from the source line read operation of FIG. 2B to the bit line read operation of FIG. 2A. In step S310, the memory cell is read in the new read mode.

The read operation discussed in FIG. 3 may be used further in the reliability test in the manufacture of RRAM. In an exemplary embodiment, the read operation shown in FIG. 3 is repeatedly performed at a high temperature (e.g. 85° C.) to sift out the bad products with poor electronic characteristics.

Figure 4A:
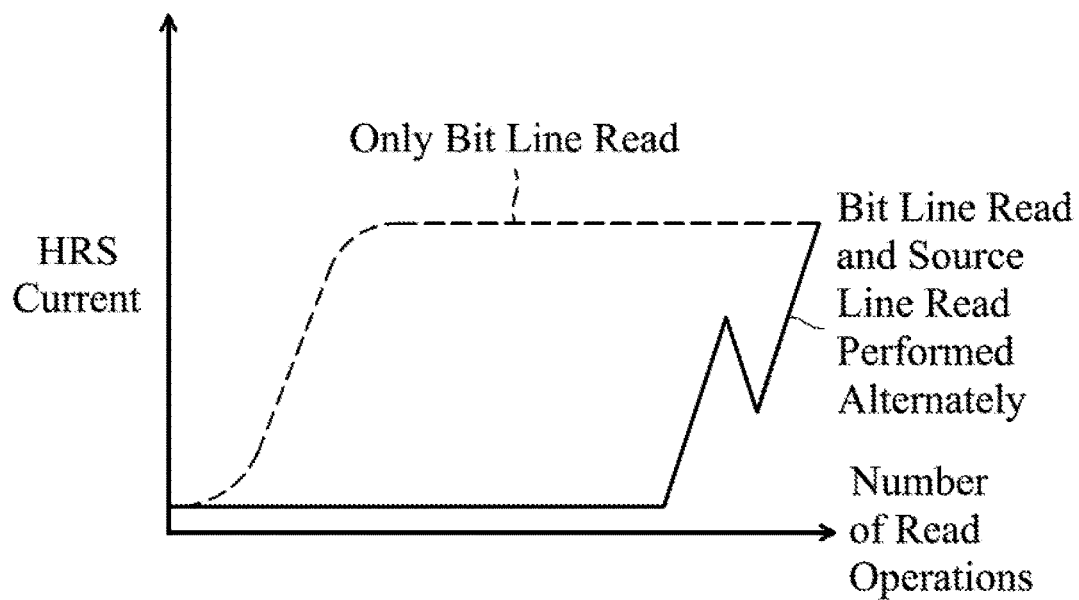
FIG. 4A shows how the current of a memory cell in the high resistance state (HRS) changes with the number of read operations.

FIG. 4A shows how the current of a memory cell in the high resistance state (HRS) changes with the number of read operations. As shown, in comparison with always using the bit line read operation (represented by a dotted line), it is better to read a memory cell by switching between the bit line read operation of FIG. 2A and the source line read operation of FIG. 2B (represented by a solid line). By alternately using the bit line read operation of FIG. 2A and the source line read operation of FIG. 2B, the read current of the memory cell in the high resistance state is effectively restrained.

Figure 4B:
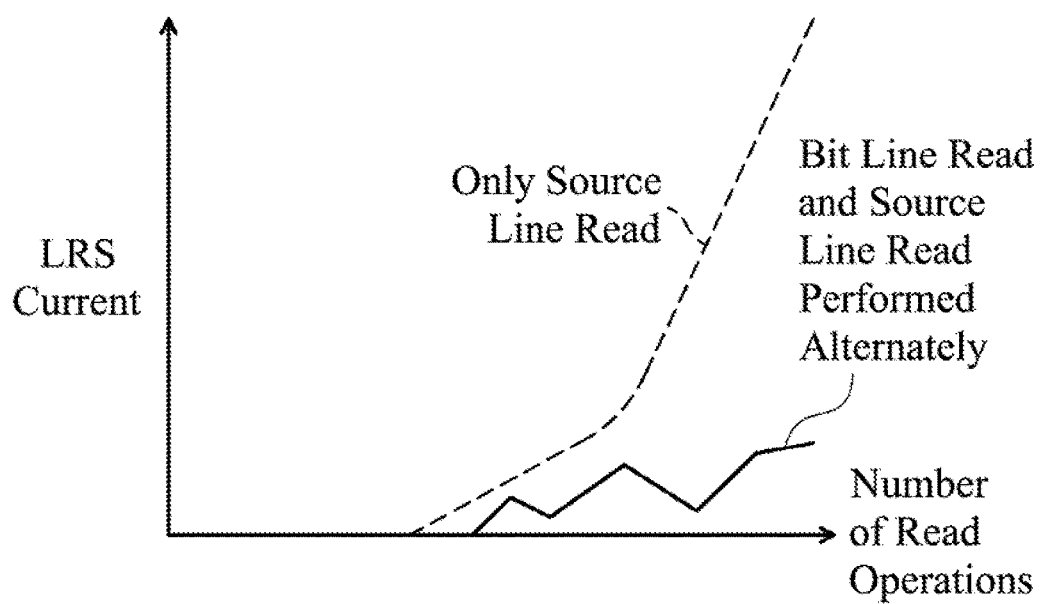
FIG. 4B shows how an attenuation coefficient (inverse to the read current) of a memory cell in the low resistance state (LRS) changes with the number of read operations.

FIG. 4B shows how an attenuation coefficient (inverse to the read current) of a memory cell in the low resistance state (LRS) changes with the number of read operations. As shown, in comparison with always using the source line read operation (represented by a dotted line), it is better to read a memory cell by switching between the bit line read operation of FIG. 2A and the source line read operation of FIG. 2B (represented by a solid line). By alternately using the bit line read operation of FIG. 2A and the source line read operation of FIG. 2B, the attenuation coefficient of an LRS memory cell is effectively restrained.

In another exemplary embodiment, the counting of same-mode read operations is not performed on just one single memory cell. The entire memory cell array 102 is monitored. When M times of bit line read operations on the memory cell array 102 (on any memory cell) is reached, the whole memory cell array 102 is switched to the source line read mode. When N times of source line read operations on the memory cell array 102 (on any memory cell) is reached, the whole memory cell array 102 is switched to the bit line read mode.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive random access memory, comprising:
a plurality of memory cells provided within a memory cell array with one target memory cell among the plurality of memory cells controlled via a word line, a bit line and a source line; and
a control unit comprising:
a word line decoder, operative to set a voltage for the word line;
a bit line decoder, operative to set a voltage for the bit line;
a source line decoder, operative to set a voltage for the source line; and
a switch circuit, switched between a first state and a second state alternately for reliability testing to operate the bit line decoder to apply a first read voltage to the bit line to read the target memory cell by a first-direction read current and to operate the source line decoder to apply a second read voltage to the source line to read the target memory cell by a second-direction read current alternately,
wherein:
when the switch circuit is in the first state, the whole memory cell array is in a bit-line read mode corresponding to the first-direction read current;
when the switch circuit is in the second state, the whole memory cell array is in a source-line read mode corresponding to the second-direction read current;
the switch circuit is switched from the first state to the second state for every M bit-line read operations, corresponding to the first-direction read current, performed on any memory cells within the memory cell array, where M is a non-zero positive number greater than one; and
the switch circuit is switched from the second state to the first state for every N bit-line read operations, corresponding to the second-direction read current, performed on any memory cells within the memory cell array, where N is a non-zero positive number greater than one.

2. The resistive random access memory as claimed in claim 1, wherein:
the target memory cell comprises a resistor and a transistor connected in series; and
the transistor has a gate coupled to the word line, a drain coupled to the resistor which is coupled to the bit line and a source coupled to the source line.

3. The resistive random access memory as claimed in claim 1, wherein:
the switch circuit is a flip-flop.

4. A manufacturing method for a resistive random access memory, comprising:
manufacturing a switch circuit in a control unit of the resistive random access memory; and
switching the switch circuit between a first state and a second state alternately for a reliability testing to operate a bit line decoder to apply a first read voltage to a bit line to read a target memory cell by a first-direction read current and to operate a source line decoder to apply a second read voltage to a source line to read the target memory cell by a second-direction read current alternately,
wherein:
the target memory cell is provided within a memory cell array and controlled via a word line, the bit line and the source line;
when the switch circuit is in the first state, the whole memory cell array is in a bit-line read mode corresponding to the first-direction read current;
when the switch circuit is in the second state, the whole memory cell array is in a source-line read mode corresponding to the second-direction read current;
the switch circuit is switched from the first state to the second state for every M bit-line read operations, corresponding to the first-direction read current, performed on any memory cells within the memory cell array, where M is a non-zero positive number greater than one; and
the switch circuit is switched from the second state to the first state for every N bit-line read operations, corresponding to the second-direction read current, performed on any memory cells within the memory cell array, where N is a non-zero positive number greater than one.

5. The manufacturing method as claimed in claim 4, further comprising:
manufacturing a resistor and a transistor in the target memory cell, wherein the resistor and the transistor are connected in series; and
coupling a gate of the transistor to the word line, a drain of the transistor to the resistor which is coupled to the bit line and a source of the transistor to the source line.

6. The manufacturing method as claimed in claim 4, further comprising:
manufacturing a flip-flop to implement the switch circuit.

7. A control method for a resistive random access memory, comprising:
providing a switch circuit in a control unit of the resistive random access memory; and
reading a target memory cell of the resistive random access memory by a first-direction read current and a second-direction read current alternately for reliability testing, wherein the first-direction read current is generated when the switch circuit is in a first state to apply a first read voltage to a bit line coupled to the target memory cell and the second-direction read current is generated when the switch circuit is in a second state to apply a second read voltage to a source line coupled to the target memory cell,
wherein the target memory cell is provided within a memory cell array and controlled via a word line, the bit line and the source line;
when the switch circuit is in the first state, the whole memory cell array is in a bit-line read mode corresponding to the first-direction read current;
when the switch circuit is in the second state, the whole memory cell array is in a source-line read mode corresponding to the second-direction read current;
the switch circuit is switched from the first state to the second state for every M bit-line read operations, corresponding to the first-direction read current, performed on any memory cells within the memory cell array, where M is a non-zero positive number greater than one; and
the switch circuit is switched from the second state to the first state for every N bit-line read operations, corresponding to the second-direction read current, performed on any memory cells within the memory cell array, where N is a non-zero positive number greater than one.

8. The control method as claimed in claim 7, further comprising:
   providing a resistor and a transistor in the target memory cell, wherein the resistor and the transistor are connected in series; and
   wherein a gate of the transistor is coupled to the word line, a drain of the transistor is coupled to the resistor which is coupled to the bit line and a source of the transistor is coupled to the source line.

9. The control method as claimed in claim 7, wherein the switch circuit is implemented by a flip-flop.

10. The resistive random access memory as claimed in claim 1, wherein:
    every M times after the control unit operates the bit line decoder to apply the first read voltage to any bit line of the resistive random access memory to read any memory cell by the first-direction read current, the control unit switches the switch circuit and thereby the control unit changes to operate the source line decoder to apply the second read voltage;
    every N times after the control unit operates the source line decoder to apply the second read voltage to any source line of the resistive random access memory to read any memory cell by the second-direction read current, the control unit switches the switch circuit and thereby the control unit changes to operate the bit line decoder to apply the first read voltage.

11. The manufacturing method as claimed in claim 4, wherein:
    every M times after the bit line decoder applies the first read voltage to any bit line of the resistive random access memory to read any memory cell of the resistive random access memory by the first-direction read current, the switch circuit is switched to operate the source line decoder to apply the second read voltage;
    every N times after the source line decoder applies the second read voltage to any source line of the resistive random access memory to read any memory cell of the resistive random access memory by the second-direction read current, the switch circuit is switched to operate the bit line decoder to apply the first read voltage.

* * * * *